US005751061A

United States Patent [19]
Mays et al.

[11] Patent Number: 5,751,061
[45] Date of Patent: May 12, 1998

[54] SEMICONDUCTOR DIODE DEVICE WITH NON-PLANAR HEATSINK AND METHOD OF MANUFACTURE

[75] Inventors: Lonne L. Mays, Gilbert, Ariz.; Jean-Baptiste Martin, Toulouse, France; Hiep M. Le; James G. Lippmann, both of Phoenix, Ariz.

[73] Assignee: Motorola, Inc., Schaumburg, Ill.

[21] Appl. No.: 573,844

[22] Filed: Dec. 18, 1995

[51] Int. Cl.$^6$ .................................................. H01L 23/34
[52] U.S. Cl. ........................ 257/707; 257/719; 257/727; 257/796
[58] Field of Search ......................... 257/99, 694, 707, 257/718, 719, 727, 730, 796

[56] References Cited

U.S. PATENT DOCUMENTS

| | | | |
|---|---|---|---|
| 3,996,602 | 12/1976 | Goldberg et al. | 257/790 |
| 4,093,958 | 6/1978 | Riccio, Jr. | 257/694 |
| 4,759,829 | 7/1988 | Fuccello, Sr. et al. | 204/15 |
| 4,935,803 | 6/1990 | Kalfus et al. | 257/666 |
| 5,081,067 | 1/1992 | Shimizu et al. | 257/722 |
| 5,172,755 | 12/1992 | Samarov | 361/386 |

*Primary Examiner*—Minh-Loan Tran
*Attorney, Agent, or Firm*—George C. Chen

[57] ABSTRACT

A semiconductor diode device (10) includes two heatsinks (11, 12), a semiconductor substrate (15) having a p-n junction (35) and located between the two heatsinks (11, 12), solder (13, 14) between the heatsinks (11, 12) and the semiconductor substrate (15), and a packaging material (16) covering the semiconductor substrate (15), the solder (13, 14), and a portion of the two heatsinks (11, 12). The two heatsinks (11, 12) each have a curved surface (21, 22), which reduces tilting of the semiconductor substrate (15), reduces temperature gradients across surfaces (23, 24) of the semiconductor substrate (15), and improves the reliability of the semiconductor diode device (10). The two heatsinks (11, 12) also include protrusions (19, 20), which help to keep the packaging material (16) covering the curved surfaces (21, 22) of the heatsinks (11, 12).

20 Claims, 1 Drawing Sheet

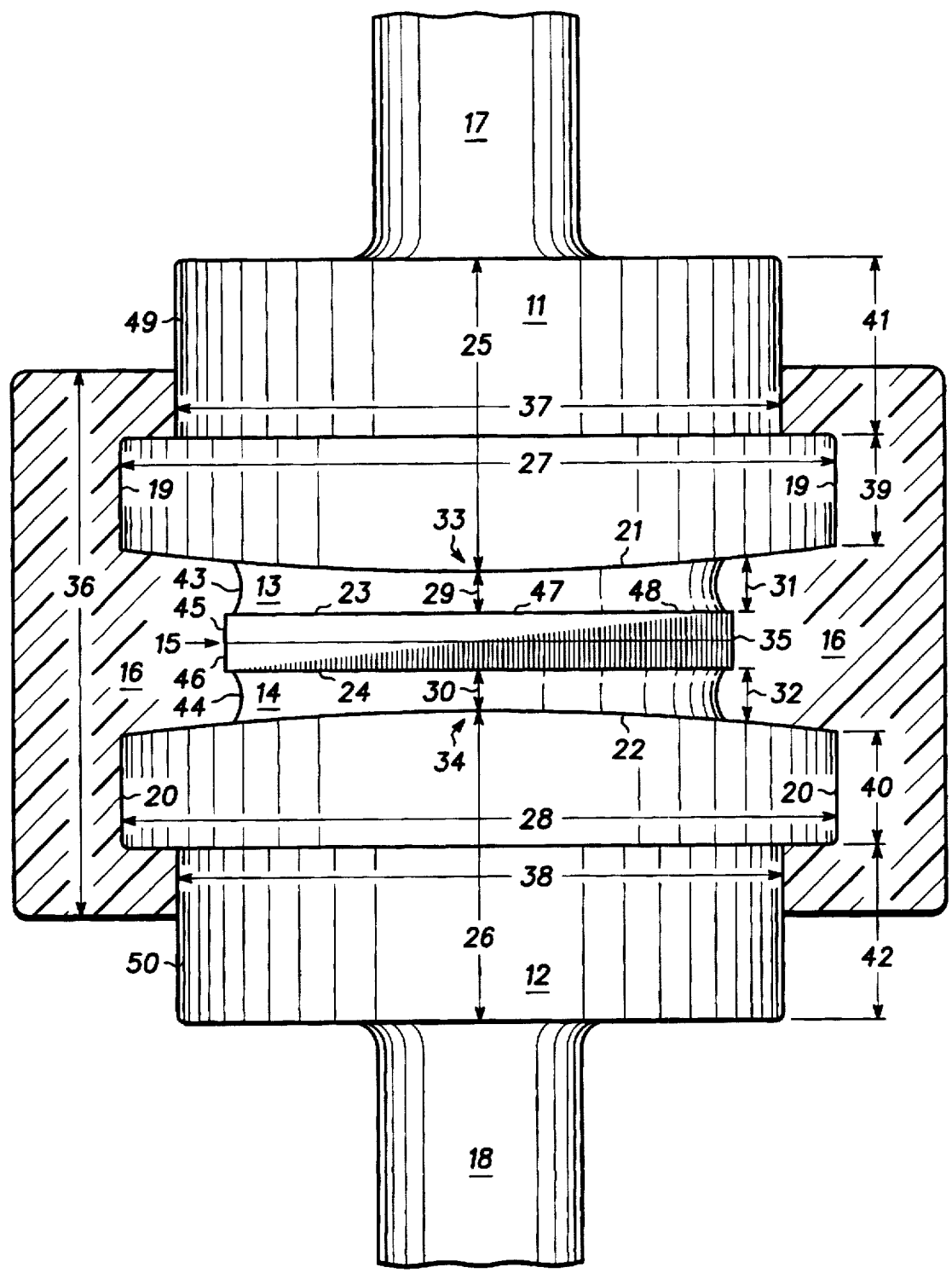

SEMICONDUCTOR DIODE DEVICE WITH NON-PLANAR HEATSINK AND METHOD OF MANUFACTURE

BACKGROUND OF THE INVENTION

This invention relates, in general, to a semiconductor component, and more particularly, to a heatsink for a semiconductor diode device.

Button diodes are commonly used in power applications and are typically composed of a semiconductor die located between two heatsinks with solder between the semiconductor die and the heatsinks. The semiconductor die in a button diode conventionally includes a p-n junction diode with a p-type region on one side of the semiconductor die and an n-type region on an opposite side of the semiconductor die. The two heatsinks on opposite sides of the semiconductor die dissipate heat from the semiconductor die and also provide electrical connections to the semiconductor die.

Ideally, the semiconductor die is parallel to the planar surfaces of the two heatsinks that face the semiconductor die. The solder located between the heatsinks and the semiconductor die mechanically buffers the semiconductor die from the heatsinks. However, the semiconductor die is often not level and, instead, is tilted between the two heatsinks. Consequently, one side of the semiconductor die contacts a heatsink, and as a result, the tilted semiconductor die is physically stressed by the heatsinks and is mechanically damaged. The mechanical damage produces high leakage currents when the button diode is subjected to compressive stress, such as that which occurs at low subambient temperatures or under certain mounting configurations.

Accordingly, a need exists for a semiconductor diode device that eliminates damage to a tilted semiconductor die. The semiconductor diode device should be easy to manufacture, cost-effective, and reliable.

BRIEF DESCRIPTION OF THE DRAWINGS

The single FIGURE illustrates a cross-sectional schematic view of an embodiment of a semiconductor diode device in accordance with the present invention.

DETAILED DESCRIPTION OF THE DRAWINGS

Turning to the single figure for a more detailed description of the present invention, a cross-sectional schematic view of an embodiment of a semiconductor component or semiconductor diode device 10 includes a semiconductor substrate 15 located between a heatsink 11 and a heatsink 12. Wires 17 and 18 are coupled to heatsinks 11 and 12, respectively. Solder 13 is located between heatsink 11 and a surface 23 of semiconductor substrate 15, and solder 14 is located between heatsink 12 and a surface 24 of semiconductor substrate 15. An encapsulant or packaging material 16 encapsulates or covers semiconductor substrate 15, solder 13 and 14, and all or portions of heatsinks 11 and 12.

More specifically, semiconductor substrate 15 is comprised of a semiconductor such as, for example, silicon or gallium arsenide. A p-n junction 35, which has a region 45 and a region 46, is conventionally fabricated in semiconductor substrate 15, which can be an open junction die or a glass passivated die. Regions 45 and 46 extend to surfaces 23 and 24, respectively, of semiconductor substrate 15. Preferably, opposite surfaces 23 and 24 each have a surface area of approximately 0.15–0.2 centimeters squared ($cm^2$). In a preferred embodiment, region 45 is a p-type region of p-n junction 35, and region 46 is an n-type region of p-n junction 35. However, in an alternative embodiment, regions 45 and 46 represent an n-type and a p-type region, respectively. In still another embodiment, semiconductor substrate 15 contains other semiconductor devices (not shown).

Heatsinks 11 and 12 are preferably similar in composition and are also preferably substantially symmetrical in shape to facilitate inventory management in a manufacturing environment. Heatsinks 11 and 12 are used to dissipate heat from semiconductor substrate 15. Accordingly, heatsinks 11 and 12 should have a thickness and mass sufficient for transient and steady state conductive heat transfer from p-n junction 35. Additionally, heatsinks 11 and 12 are preferably used as electrical contacts for p-n junction 35.

Heatsinks 11 and 12 can be used with varying sizes of semiconductor substrates. However, heatsinks 11 and 12 preferably have a diameter at least as large as a diameter of semiconductor substrate 15. In a preferred embodiment, heatsinks 11 and 12 each have a diameter of approximately 0.3–0.9 centimeters (cm) and have heights 25 and 26, respectively, which are each approximately 0.1–0.6 cm.

Heatsinks 11 and 12 are comprised of copper and have a nickel plating in a preferred embodiment of the present invention. Preferably, the nickel is applied to the copper using an electroplating or electroless plating process. In an alternative embodiment, heatsinks 11 and 12 are comprised of any suitable heat conducting and electrically conducting material including, but not limited to, copper without a nickel plating, gold, silver, platinum, and nickel plated aluminum. Preferably, heatsinks 11 and 12 are more thermally conductive than semiconductor substrate 15 but have a thermal coefficient of expansion similar to semiconductor substrate 15. If semiconductor substrate 15 is an open junction die, heatsinks 11 and 12 are preferably comprised of a material that is capable of withstanding a caustic etch used to remove dicing damage at the edges of semiconductor substrate 15.

Heatsinks 11 and 12 can be molded or cast into cylindrical shapes using techniques known in the art. However, heatsinks 11 and 12 are preferably fabricated by using a stamping, extrusion, or other cold formed metal working process. The preferred stamping or extrusion process can form spherical, dome-shaped, round, or curved surfaces 21 and 22 in heatsinks 11 and 12, respectively, that face toward or are adjacent to surfaces 23 and 24, respectively, of semiconductor substrate 15. Curved surfaces 21 and 22 preferably have a curvature that can be compared to portions of a sphere having a radius of approximately 3–7 cm. In a preferred embodiment, the surface area of curved surfaces 21 and 22 are both larger than the individual surface areas of surfaces 23 and 24.

In an alternative embodiment, portions 33 and 34 of curved surfaces 21 and 22, respectively, are flat or planar. In this embodiment, portions 33 and 34 each have a preferred diameter of approximately 0.13–0.2 cm and a preferred surface area of approximately 0.016–0.04 $cm^2$, which is substantially less than the surface area of each of surfaces 23 and 24 of semiconductor substrate 15.

The reason for these flat portions 33 and 34 at the center of curved surfaces 21 and 22, respectively, relates to the manufacturing of heatsinks 11 and 12. Stamping die used to stamp or extrude heatsinks 11 and 12 will erode after stamping or extruding thousands of heatsinks. The erosion of the stamping die occurs, among other locations, at a region that shapes portions 33 and 34 of heatsinks 11 and 12 and eventually produces heatsinks with a sharp point at portions 33 and 34. A sharp point at the center of curved surfaces 21 and 22 is highly undesirable because it will tilt semiconductor substrate 15 even more than the prior art heatsinks as explained below. Therefore, to compensate for the stamping die erosion and to lengthen the usefulness of the stamping die, portions 33 and 34 are designed to be flat. After several thousand uses, the stamping die will be eroded such that portions 33 and 34 are no longer flat, but instead are curved.

Heatsinks 11 and 12 of the present invention also preferably contain protrusions 19 and 20, respectively, which circumscribe or are located around a periphery or perimeter of curved surfaces 21 and 22, respectively. In a preferred embodiment, protrusions 19 and 20 have diameters 27 and 28, respectively, which are each approximately 0.4–0.9 cm, and also have heights 39 and 40, respectively, which are each approximately 0.05–0.2 cm.

Base portions 49 and 50 of heatsinks 11 and 12, respectively, support protrusions 19 and 20, respectively. In a preferred embodiment, base portions 49 and 50 have diameters 37 and 38, respectively, which are each approximately 0.3–0.8 cm. Base portions 49 and 50 preferably have a smaller diameter compared to protrusions 19 and 20, respectively, to create a mold-locking feature, which ensures that heatsink 11 remains encapsulated by packaging material 16 as explained below. However, diameters 37 and 38 of base portions 49 and 50, respectively, can be the same size as, smaller than, or greater than the diameter of semiconductor substrate 15. Base portions 49 and 50 have heights 41 and 42, respectively, which are preferably each approximately 0.2–0.35 cm.

A preferred method of fabricating semiconductor diode device 10 uses the following process steps. First, semiconductor substrate 15, which includes p-n junction 35, is manufactured as described above. Second, heatsinks 11 and 12 are stamped and then plated, as mentioned previously.

Next, two solder preforms are provided. Solder 13 and 14 in the single figure represent the two solder preforms after a thermal process described below. The solder preforms are preferably comprised of lead, indium, and silver having an approximate 92.5, 5.0, and 2.5 percent volume by weight, respectively. However, other suitable solder compositions including, but not limited to, silver and tin that are electrically and thermally conductive can be used in an alternative embodiment. In a preferred embodiment, the solder preforms are both cylindrical in shape and approximately 0.2–0.4 cm in diameter and approximately 50–200 microns in height. It is noted that other solder preform shapes can be used in accordance with the present invention. However, it is preferred that the diameters of the solder preforms are smaller than the diameters of semiconductor substrate 15 and protrusions 19 and 20. In an alternative embodiment, solder paste or a conductive adhesive can be used in place of solder preforms.

Next, a thermal process is performed to melt the two solder preforms to couple semiconductor substrate 15 and heatsinks 11 and 12. Prior to the thermal process, a solder preform is disposed or positioned over heatsink 12; semiconductor substrate 15 is disposed or provided over the solder preform; another solder preform is disposed over semiconductor substrate 15; and heatsink 11 is disposed over the other solder preform. Therefore, a sandwich structure having a heatsink, solder, semiconductor substrate, solder, and a heatsink is formed. In a preferred embodiment where solder 13 and 14 comprises lead, indium, and silver, the sandwich structure is treated in a thermal process for approximately 30–60 minutes. Heatsinks 11 and 12, solder 13 and 14, and semiconductor substrate 15 are preferably heated in a belt furnace to a temperature of approximately 300–500 degrees Celsius (°C.) in an atmosphere of nitrogen or hydrogen with nitrogen. It is understood that other times and temperatures can be used in accordance with the present invention, especially when solder 13 and 14 is comprised of a mixture other than lead, indium, and silver or when solder 13 and 14 is comprised of a brazing alloy.

After the thermal process, the sandwich structure is cooled. At this step, at least 95 percent of surfaces 23 and 24 of semiconductor substrate 15 are preferably covered by solder 13 and 14, respectively. Then, the sandwich structure is encapsulated with an encapsulant or packaging material 16 such as, for example, HYSOL™ MG40F available from Dexter Corporation of Olean, N.Y. However, in an alternative embodiment, any appropriate encapsulant can be used in accordance with the present invention. In a preferred embodiment where packaging material 16 comprises HYSOL™ MG40F, packaging material is molded at a temperature of approximately 110–175° C. and at a pressure of approximately 30–75 bars. Packaging material 16 is then preferably cured to cross-link the compound at a temperature of approximately 150°–175° C. for approximately 2–5 minutes. Packaging material 16 preferably has a thickness 36 of approximately 0.3–0.6 cm.

Regardless of its composition, packaging material 16 covers, encapsulates, or is molded around semiconductor substrate 15, solder 13 and 14, and at least portions of curved surfaces 21 and 22 of heatsinks 11 and 12, respectively. Packaging material 16 also preferably encapsulates protrusions 19 and 20 of heatsinks 11 and 12, respectively, as portrayed in the illustrated embodiment. Protrusion 19 provides a mold-locking feature to ensure that curved surface 21 of heatsink 11 remains encapsulated by packaging material 16. Similarly, protrusion 20 ensures that curved surface 22 of heatsink 12 remains covered by packaging material 16.

After the above described encapsulation process, wires 17 and 18 are coupled to base portions 49 and 50, respectively, to provide electrical contact to heatsinks 11 and 12, respectively. Wire 17 is attached to heatsink 11 using, for example, a suitable assembly fixture, solder preforms or paste, and a belt furnace. A similar process can be used to attach wire 18 to heatsink 12. In a preferred embodiment, wires 17 and 18 have a diameter of approximately 1–2 millimeters and are comprised of a material similar to heatsinks 11 and 12 to alleviate issues associated with different thermal coefficients of expansion. However, in an alternative embodiment, any appropriate electrical conductor can be substituted for wires 17 and 18. In still another embodiment of the present invention, semiconductor diode device 10 does not include wires 17 and 18 and is used as a surface mount device.

The resulting semiconductor diode device 10, which is manufactured using the above described process, has several advantages over the prior art. In particular, curved surfaces 21 and 22 of heatsinks 11 and 12, respectively, assist in equalizing the solder wetting forces around a perimeter of semiconductor substrate 15 during the molten stage of solder 13 and 14 described above. Consequently, semiconductor substrate 15 has a lower tendency to tilt compared to the prior art.

As discussed previously, portions 33 and 34 of heatsinks 11 and 12, respectively, may be flat to prevent the erosion of the stamping die from forming a sharp point at portions 33 and 34. A sharp point at portions 33 and 34 would increase the tendency or probability of tilting semiconductor substrate 15.

However, even if semiconductor substrate 15 does tilt, curved surfaces 21 and 22 permit semiconductor substrate 15 to tilt several degrees relative to the plane of diameters 27, 28, 37, or 38 without having any of the corners of semiconductor substrate 15 physically touching heatsinks 11 and 12. As discussed previously, when corners of a semiconductor substrate contact a heatsink in a conventional button diode, the semiconductor substrate is mechanically damaged by the heatsink because the semiconductor substrate is no longer buffered from the heatsink by the solder. This mechanical damage is due to a variety of factors including, but not limited to, physical handling of semiconductor diode device 10, compressive forces resulting from the contraction of semiconductor diode device 10 at low temperatures of around −40° C., or external forces generated while forming wires 17 and 18 to enable insertion of semiconductor diode device 10 in a printed wiring board (not shown). However, in the present invention, even if semiconductor substrate 15 were tilted, the corners or edges of semiconductor substrate 15 will not physically contact heatsinks 11 and 12 because curved surfaces 21 and 22 curve away from semiconductor substrate 15.

Curved surfaces 21 and 22 also promote the outgassing of solder 13 and 14 and aid in reducing the probability of forming a solder void in solder 13 and 14 during the thermal process described above. It is believed that air pockets in the solder can be pushed out of the solder due to curved surfaces 21 and 22 of the present invention.

Furthermore, during the previously mentioned thermal process, curved surface 21 of heatsink 11 forms or creates a plano-concave lens shaped solder joint 43 for solder 13 between semiconductor substrate 15 and heatsink 11. Similarly, curved surface 22 of heatsink 12 forms or produces a plano-concave lens shaped solder joint 44 for solder 14 between heatsink 12 and semiconductor substrate 15. The uniquely shaped solder joints of semiconductor diode device 10 are more robust to clamping stresses encountered during the above described molding process of packaging material 16. Computer simulations have predicted that the unique shape of solder 13 and 14 can reduce the stress and strain of solder joints 43 and 44 by about 70 percent compared to the solder joints of the prior art, which use planar heatsinks. This stress reduction greatly increases the reliability, thermal cycle lifetime, and power cycle lifetime of semiconductor diode device 10.

The stress reduction is due to the increased thickness of solder 13, 14 at edges of semiconductor substrate 15 compared to the prior art. For similar reasons, semiconductor diode device 10 is also more resistant to solder joint fatigue resulting from a mismatch in thermal coefficients of expansion between heatsinks 11 and 12 and semiconductor substrate 15. Again, solder 13 and 14 serves to buffer semiconductor substrate 15 from the mechanical stresses of heatsinks 11 and 12.

The unique shape of solder 13 and 14 also reduces the temperature difference across surfaces 23 and 24 of semiconductor substrate 15 during both steady state and pulsed power operations. In the prior art, the center of the semiconductor substrate typically generates more heat compared to the edges of the semiconductor substrate during the operation of the diode. However, the temperature at a central region 47 of surface 23 is reduced in the present invention compared to the prior art. Therefore, this reduction in temperature difference produces a more uniform temperature distribution across surfaces 23 and 24 and also assists in improving the reliability of semiconductor diode device 10.

The temperature at central region 47 of surface 23 is reduced relative to an outer region 48 because curved surface 21 increases the spacing or distance between heatsink 11 and surface 23 when moving from central region 47 to outer region 48 of surface 23. Accordingly, a spacing or distance 29 between central region 47 of semiconductor substrate 15 and portion 33 of heatsink 11 is smaller than a spacing or distance 31, which is between region 48 of semiconductor substrate 15 and heatsink 11. Therefore, heatsink 11 is closer to region 47 than region 48, and the heat transfer or dissipation efficiency from region 47 to heatsink 11 is higher than from region 48 to heatsink 11. A smaller spacing between heatsink 11 and semiconductor substrate 15 improves the thermal transfer efficiency because solder 13 is a poor thermal conductor compared to heatsink 11. Thus, the temperature at region 47 is reduced. Similarly, a distance 30 is smaller than a distance 32 between semiconductor substrate 15 and heatsink 12, and thus, the temperature at a central portion or region of surface 24 is also reduced.

In an alternative embodiment where curved surface 21 includes flat portion 33, distance 29 is between flat portion 33 and semiconductor substrate 15, and distance 31 is between curved surface 21 and semiconductor substrate 15. In a preferred embodiment, a minimum distance between semiconductor substrate 15 and heatsinks 11 and 12 is approximately 25–75 microns. Accordingly, distances 29 and 30 are preferably each about 25–75 microns, and distances 31 and 32 are preferably each about 200–250 microns.

While the invention has been particularly shown and described with reference to preferred embodiments, it will be understood by those skilled in the art that changes in form and detail may be made without departing from the spirit and scope of the invention. For instance, it is understood that heatsink 11 and wire 17 can be a single wire. The tip of the single wire can be mechanically shaped to include curved surface 21 of heatsink 11. Similarly, heatsink 12 and wire 18 can be a single wire having curved surface 22 of heatsink 12.

Therefore, in accordance with the present invention, it is apparent there has been provided an improved semiconductor diode device that overcomes the disadvantages of the prior art. The present invention reduces tilting of a semiconductor substrate between two heatsinks, eliminates mechanical damage to edges of the semiconductor substrate, improves the reliability of a semiconductor diode device, and reduces temperature gradients across surfaces of the semiconductor substrate.

We claim:

1. A semiconductor diode device comprising:
   a p-n junction having a first region and a second region;
   a first heatsink coupled to the first region of the p-n junction, the first heatsink having a first dome-shaped surface facing towards the p-n junction; and
   a second heatsink coupled to the second region of the p-n junction, the second heatsink having a second dome-shaped surface and facing towards the p-n junction.

2. The semiconductor diode device according to claim 1, wherein the first region is n-type, and wherein the second region is p-type.

3. The semiconductor diode device according to claim 1, further comprising an encapsulant covering the p-n junction, a first portion of the first dome-shaped surface of the first heatsink, and a second portion of the second dome-shaped surface of the second heatsink.

4. The semiconductor diode device according to claim 3, wherein the first heatsink has a protrusion circumscribing the first dome-shaped surface, the protrusion covered by the encapsulant.

5. The semiconductor diode device according to claim 1, further comprising a semiconductor substrate containing the p-n junction, the semiconductor substrate having a surface facing the first dome-shaped surface of the first heatsink, wherein a first surface area of the first dome-shaped surface of the first heatsink is larger than a second surface area of the surface of the semiconductor substrate.

6. The semiconductor diode device according to claim 5, wherein a minimum distance between the first heatsink and the semiconductor substrate is approximately 25–75 microns.

7. The semiconductor diode device according to claim 1, wherein the first and second heatsinks are electrical contacts for the p-n junction.

8. The semiconductor diode device according to claim 1, wherein the first and second heatsinks are substantially symmetrical.

9. A semiconductor diode device comprising:

a p-n junction having a first region and a second region;

a first heatsink coupled to the first region of the p-n junction, the first heatsink having a first dome-shaped surface;

a second heatsink coupled to the second region of the p-n junction, the second heatsink having a second dome-shaped surface; and a semiconductor substrate containing the p-n junction, the semiconductor substrate having a surface facing the first dome-shaped surface of the first heatsink, wherein a first surface area of the first dome-shaped surface of the first heatsink is larger than a second surface area of the surface of the semiconductor substrate, wherein a minimum distance between the first heatsink and the semiconductor substrate is approximately 25–75 microns, and wherein a distance between the first heatsink and the semiconductor substrate increases from a central region of the semiconductor substrate to an outer region of the semiconductor substrate.

10. A semiconductor component comprising:

a semiconductor substrate having a surface with a region and an outer perimeter;

a heatsink having a surface facing towards the surface of the semiconductor substrate wherein a distance between the surface of the heatsink and the surface of the semiconductor substrate increases from the region of the semiconductor substrate to the outer perimeter of the semiconductor substrate; and an encapsulant covering the semiconductor substrate and the heatsink.

11. The semiconductor component according to claim 10, further comprising solder between the semiconductor substrate and the heatsink.

12. The semiconductor component according to claim 11, wherein the solder forms a plano-concave lens shaped solder joint between the surface of the semiconductor substrate and the round surface of the heatsink.

13. The semiconductor component according to claim 10, wherein the heatsink has a protrusion covered by the encapsulant.

14. A semiconductor component comprising:

a semiconductor substrate having a surface; and a heatsink having a round surface adjacent to the surface of the semiconductor substrate wherein the round surface has a flat portion, the flat portion having a surface area less than a surface area of the surface of the semiconductor substrate.

15. The semiconductor component of claim 14 wherein the semiconductor substrate overlies the flat portion of the heatsink.

16. A semiconductor component comprising:

a semiconductor substrate having a p-n junction, a first surface, and a second surface opposite the first surface, wherein a p-type region of the p-n junction extends to the first surface and wherein an n-type region of the p-n junction extends to the second surface;

a first solder joint adjacent to the first surface of the semiconductor substrate;

a second solder joint adjacent to the second surface of the semiconductor substrate;

a first heatsink having a first curved surface facing towards the first solder joint;

a second heatsink having a second curved surface facing towards the second solder joint; and a packaging material encapsulating the semiconductor substrate, the first solder joint, the second solder joint, a first portion of the first curved surface of the first heatsink, and a second portion of the second curved surface of the second heatsink.

17. The semiconductor component according to claim 16, wherein the first heatsink is a portion of a first wire and wherein the second heatsink is a portion of a second wire.

18. The semiconductor component according to claim 16, wherein the first heatsink has a first protrusion around a first perimeter of the first curved surface and wherein the second heatsink has a second protrusion around a second perimeter of the second curved surface.

19. A semiconductor component comprising:

a semiconductor substrate having a p-n junction, a first surface, and a second surface opposite the first surface, wherein a p-type region of the p-n junction extends to the first surface and wherein an n-type region of the p-n junction extends to the second surface;

a first solder joint adjacent to the first surface of the semiconductor substrate;

a second solder joint adjacent to the second surface of the semiconductor substrate;

a first heatsink having a first curved surface adjacent to the first solder joint;

a second heatsink having a second curved surface adjacent to the second solder joint; and a packaging material encapsulating the semiconductor substrate, the first solder joint, the second solder joint, a first portion of the first curved surface of the first heatsink, and a second portion of the second curved surface of the second heatsink wherein the first and second curved surfaces are portions of a sphere having a radius of approximately 3–7 centimeters, wherein the first curved surface has a flat portion, wherein the flat portion has a diameter of approximately 0.13–0.2 centimeters, wherein the flat portion is positioned such that a first distance between the flat portion and the semiconductor substrate is smaller than a second distance between the first curved surface and the semiconductor substrate, and wherein the first and second heatsinks each have a height of approximately 0.1–0.6 centimeters and a diameter of approximately 0.3–0.9 centimeters.

20. A semiconductor component comprising:

a semiconductor substrate having a surface; and a heatsink having a curved surface facing towards the surface of the semiconductor substrate wherein the curved surface of the heatsink has a flat portion and wherein the semiconductor substrate overlies the flat portion.

* * * * *